(12) United States Patent
Beckwith

(10) Patent No.: US 6,370,483 B1
(45) Date of Patent: *Apr. 9, 2002

(54) SYNCHRONOUS LINEAR MACHINE FOR PROTECTIVE RELAYING

(76) Inventor: Robert W. Beckwith, 2794 Camden Rd., Clearwater, FL (US) 33759-1007

( * ) Notice: Subject to any disclaimer, the term of this patent is extended or adjusted under 35 U.S.C. 154(b) by 0 days.

This patent is subject to a terminal disclaimer.

(21) Appl. No.: 09/303,449

(22) Filed: May 3, 1999

Related U.S. Application Data
(60) Provisional application No. 60/089,271, filed on Jun. 15, 1998.

(51) Int. Cl.[7] .................. G01R 19/00; G01R 25/00; H02H 3/00
(52) U.S. Cl. .................. 702/65; 702/64; 702/72; 361/35; 361/79
(58) Field of Search .................. 702/64–66, 71, 702/72, 73, 70–74; 361/35, 47, 65, 79; 327/2, 3, 15, 141, 101, 104; 700/286, 292–294; 323/207, 211

(56) References Cited

U.S. PATENT DOCUMENTS

| 4,256,972 A | * | 3/1981 | Wyatt et al. .................. 307/68 |
| 4,871,971 A | * | 10/1989 | Jeerings et al. ................ 361/47 |
| 5,315,527 A | * | 5/1994 | Beckwith ...................... 702/72 |
| 5,544,064 A | * | 8/1996 | Beckwith ..................... 700/293 |
| 5,646,512 A | * | 7/1997 | Beckwith ..................... 323/257 |
| 5,774,366 A | * | 6/1998 | Beckwith ...................... 702/64 |

OTHER PUBLICATIONS

Phadke & Thorp, Computer Relaying for Power Systems John Wiley and Sons, New York, 1988 pp. 123–129.*

Altuve, Diaz, and Vasquez, Fourier and Walsh Digital Filtering Algorithms for Distance Protection, IEEE Transactions on Power, vol. 11, No. 1, Feb. 1996, pp. 457–462.*

Harlow, J.H., A Multifunction Protective Relay for the Cogeneration Industry, IEEE Computer Application in Power, vol. 3, No. 4, 1990, pp. 25–30.*

Yalla, Murty V.V.S., A Digital Multifunctional Protective Relay, IEEE Transactions on Power Delivery, vol. 7, No. 1, 1992, pp. 193–201.*

* cited by examiner

*Primary Examiner*—Bryan Bui
(74) *Attorney, Agent, or Firm*—Leo J. Aubel

(57) ABSTRACT

Synchronous programs give increased sampling rates of AC signals and provide AC phasors yielding fast response to undesired conditions.

19 Claims, 6 Drawing Sheets

SYNCHRONOUS LINEAR MACHINE FOR PROTECTIVE RELAYING

This application claims the priority date of provisional patent application Ser. No. 60/089,271 filed on Jun. 15, 1998.

BACKGROUND OF THE INVENTION

It is the present practice of a Beckwith Electric Company line of generator and transformer protective relays to sample alternating current (AC) voltage and current waves some small number of times, such as 16 per cycle, and then use Fourier transforms to compute phasor quantities representing fundamental components of the waves.

Reference is made to the following book and articles on the present related state of the art:

[1] Phadke, A. G. and J. S. Thorp, Computer Relaying for Power Systems, John Wiley and Sons, New York, 1988, pp. 123–129.
[2] Hector J., Altuve F., Ismael Diaz V. and Ernesto Vazquez M., "Fourier and Walsh digital filtering algorithms for distance protection", IEEE Transactions on Power, vol. 11, No. 1, February 1996, pp. 457–462.
[3] Harlow, J. H., "A multifunction protective relay for the cogeneration industry", IEEE Computer Application in Power, vol.3, No.4, 1990, pp.25–30.
[4] Yalla, Murty V. V. S., "A digital multifunction protective relay", IEEE Transactions on Power Delivery, vol.7, No.1, 1992, pp.193–201.

Making use of inventions as found in U.S. Pat. No. 5,224,011, MULTIFUNCTION PROTECTIVE RELAY, one typical product, model M-4320 manufactured by the Beckwith Electric Company, uses a digital signal processor (DSP) running at some 80 megabits per second, to compute Fourier transforms of the waves as digital samples are taken. The results are fed to a dual ported random access memory where they are available to a host processor. The host processor, operating at 10 megabits per second, uses the results to compute the existence of electrical fault conditions and to output commands for tripping circuit breakers so as to quickly remove electric power feeding faults.

In the M-4320 it is necessary to use analog component anti-aliasing filters to prevent errors due to problems introduced by the use of a small number of digital samples of the AC wave. Since the electronic circuit is connected to earth ground, transformers must be used for all current and voltage inputs.

Another Beckwith Electric Company product line makes use of inventions contained in U.S. Pat. No. 4,310,771 METHODS FOR TRANSFERRING POWER IN A SYNCHRONOUS MODE TO A MOTOR BUS, U.S. Pat. No. 4,256,972 POWER TRANSFER RELAY and U.S. Pat. No. 4,311,919 TRANSFER LOGIC CONTROL CIRCUITRY.

In products based on the above referenced U.S. Pat. Nos. 4,310,771, 4,256,972 and 4,311,919 a first analog device is used to develop information useable for the transfer of a motor bus from a first source to a second source, not necessarily in phase with the first, in a sequence of criteria. A second combined analog and digital device uses the information to effect the transfer. Use of these devices results in a large and expensive combination of equipment.

The transfer of motor busses is sometimes made manually for operating reasons. At other times the transfer may be initiated automatically due to the failure of a bus presently in use.

The first criterion used is called the "fast transfer" and operates if calculations indicate that the transfer can be completed while the phase angle between the two sources is within a selected phase angle window. The second criterion first separates the motors from the first source and then makes a synchronous transfer when the isolated motor bus falls behind the second source by 360 degrees. The third criterion of transfer is used if the motor bus voltage falls below a selected value before the 360 degree point is reached.

While a bus transfer device does not have the requirement to trip a circuit breaker in order to interrupt a fault current, it is classified herein as a protective device since proper operation does protect equipment from damage. In addition, as in protective relays that detect fault conditions, its operation likewise depends on a cycle by cycle measurement of voltage and current waves.

In making improvements over the present art, use is made herein of the following inventions, all by the present inventor, Robert W. Beckwith.

A) U.S. Pat. No. 5,315,527, METHOD AND APPARATUS PROVIDING HALF-CYCLE DIGITIZATION OF AC SIGNALS BY AN ANALOG-TO-DIGITAL CONVERTER, describes apparatus and methods for sensing positive half cycles of AC signals.

B) U.S. Pat. No. 5,544,064, APPARATUS AND METHOD FOR SAMPLING SIGNALS SYNCHRONOUS WITH ANALOG-TO-DIGITAL CONVERTER, describes apparatus and methods useful for obtaining digital samples of AC waves synchronous with free running analog to digital converters (ADCs).

C) U.S. Pat. No. 5,774,366, A METHOD FOR OBTAINING THE FUNDAMENTAL AND ODD HARMONIC COMPONENTS OF AC SIGNALS, describes methods for obtaining the fundamental component and odd harmonics of half wave AC signals.

D) U.S. patent application Ser. No. 710,816, TWO WAY PACKET RADIO INCLUDING SMART DATA BUFFER AND PACKET RATE CONVERSION, the inventer herein, filed on Sep. 23, 1996 describes apparatus and methods of communicating synchronously with the power frequency as useful in the present invention.

The present invention combines use of the half wave technology of U.S. Pat. No. 5,315,527 together with the synchronous linear technology of U.S. Pat. No. 5,544,064 and methods for obtaining the fundamental component and odd harmonics of a half wave AC signal of U.S. Pat. No. 5,774,366 in reducing the hardware and software requirements while at the same time increasing the operating speed of devices useful in AC electric power apparatus. Means of communicating between devices using the present invention and any of the many protocols in use at the time of writing of this application are provided by the inventive means and methods by reference U.S. patent application Ser. No. 710, 816.

U.S. Pat. No's. 5,315,527, 5,544,064, 5,774,366 and U.S. patent application Ser. No. 710,816 are incorporated herein by reference.

SUMMARY OF THE INVENTION

This invention utilizes tables of sine and cosine functions multiplied by digital samples of AC waves to obtain, by cross correlation, the values of phasors for the waves, thus eliminating the need for Fourier transform calculations required in many prior art devices. These phasors are obtained one or more times per cycle of AC voltage and current waves in order to determine output requirements, generally in the form of operation of solid state switches.

In a first microprocessor, linear programs, using fixed operating time loops, operate synchronously with microprocessor ADCs. These ADCs produce digital samples in matching loops and require no ongoing instructions from the linear programs. A second microprocessor obtains the phasor information via a high speed synchronous data bus from the first microprocessor and computes results such as fault clearing and motor bus transfer conditions. Use of linear programs loops matching those of the first microprocessor avoids data clashes between the two microprocessors. Both microprocessor programs run continuously without the use of interrupts.

Functions of the two microprocessors are combined into one microprocessor for protection of single phase equipment and for motor bus transfer.

Examples are given for use of the invention.

DETAILED DESCRIPTION OF THE PREFERRED EMBODIMENTS

The invention is described hereinunder using presently available semiconductor devices. General principles are first demonstrated and then examples of applications are shown in which selectable designer choices are illustrated. It is anticipated, however, that the general principles of the invention will be applicable using future devices not available at the time of writing of this document.

Figure 3A:
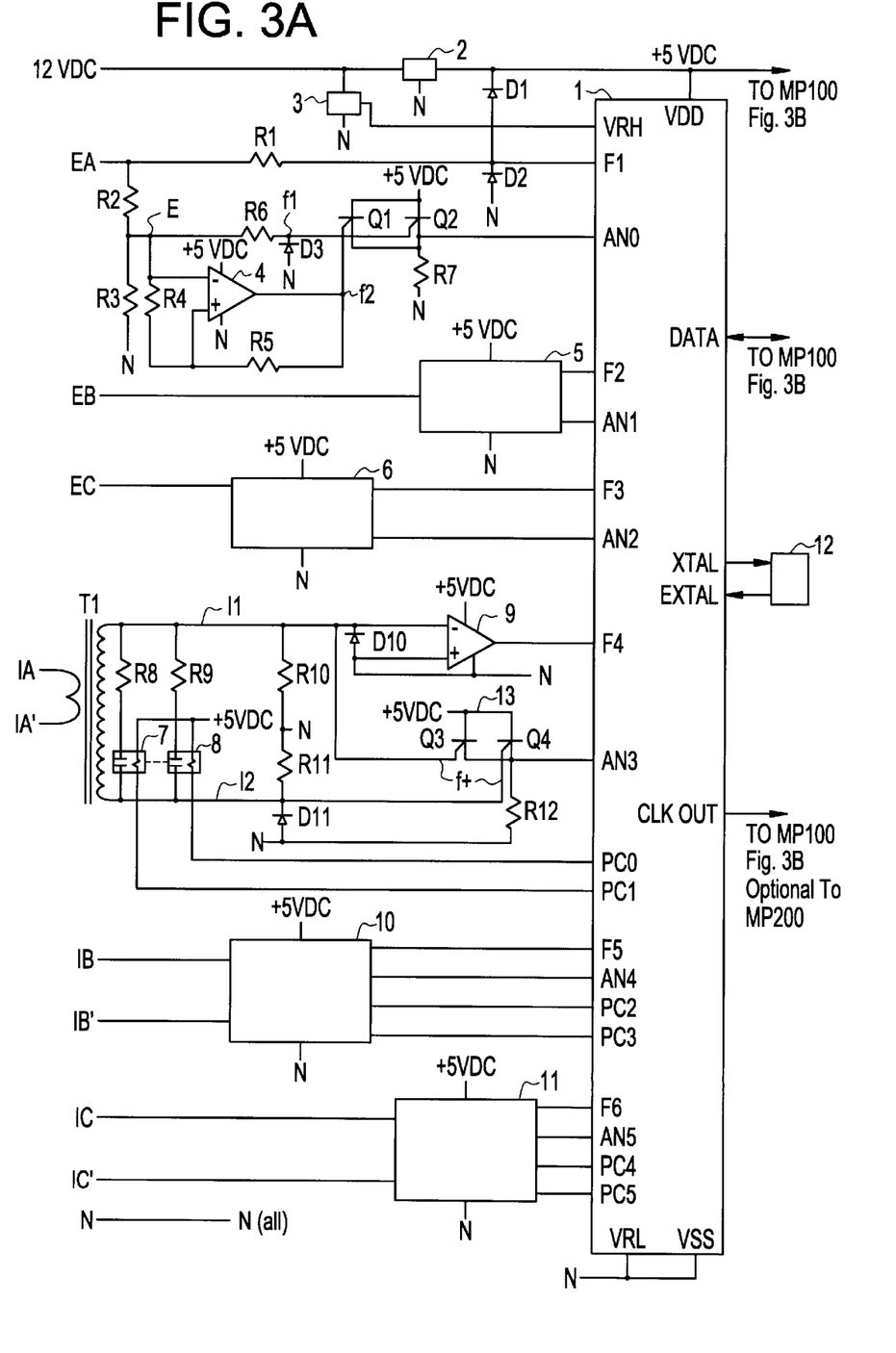
FIGS. 3a and 3b illustrates a basic circuit for three phase protective relays having three voltage and three current inputs.
Figure 3B:
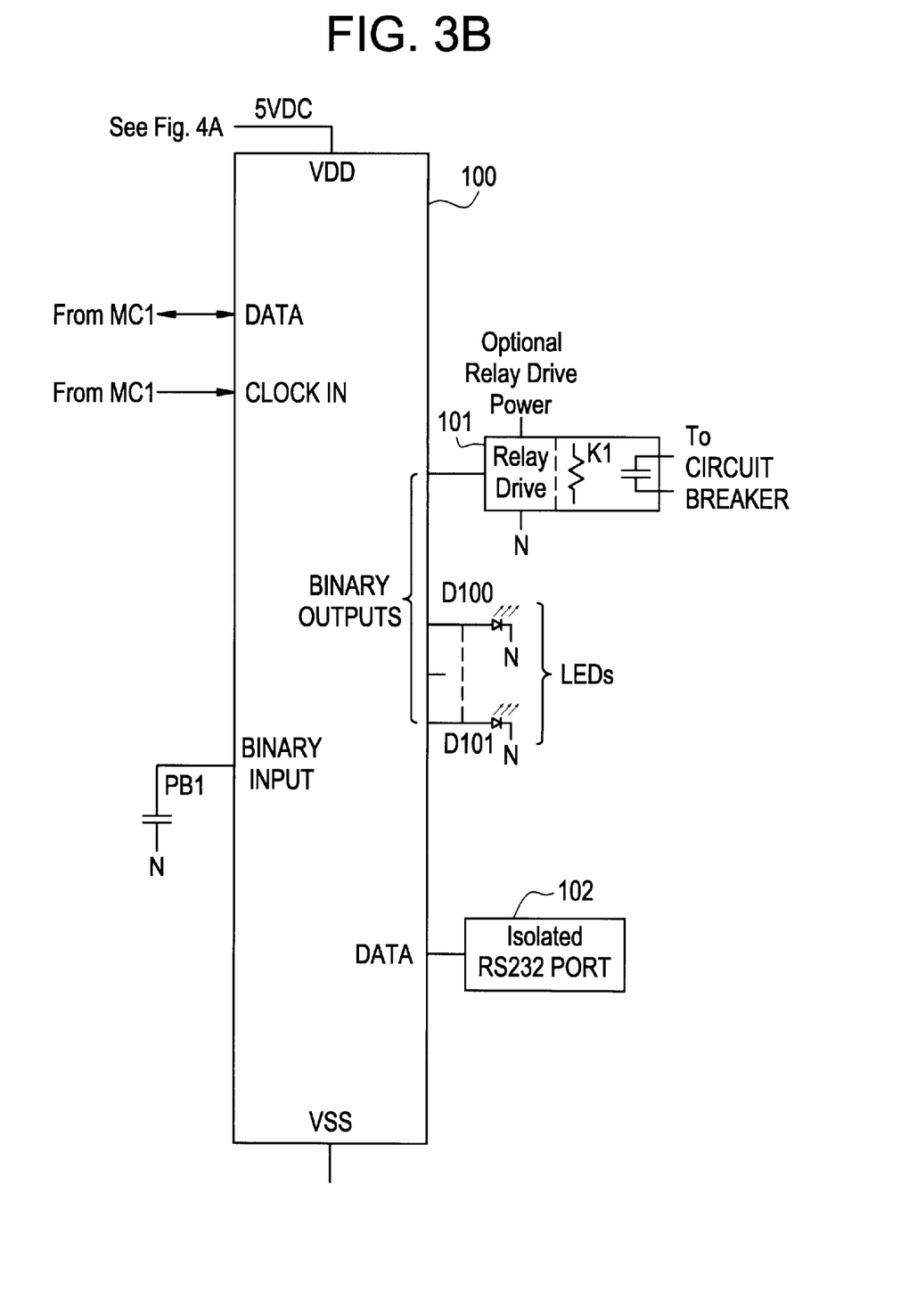

The invention is illustrated using selected Motorola microcontrollers, MC1 of FIG. 3a and MC100 of FIG. 3b, consisting of microprocessors having onboard analog to digital converters (ADC)s. References hereinunder to microprocessors MP means all of MC1 or MC100 except for the ADC portions. MC1 operates synchronously along with MC100. MC100 need not have an ADC, however it is the same device as MC1 in the illustrative circuits of FIGS. 3a and 3b since a matching MC without an ADC is not currently available from Motorola.

Figure 2:
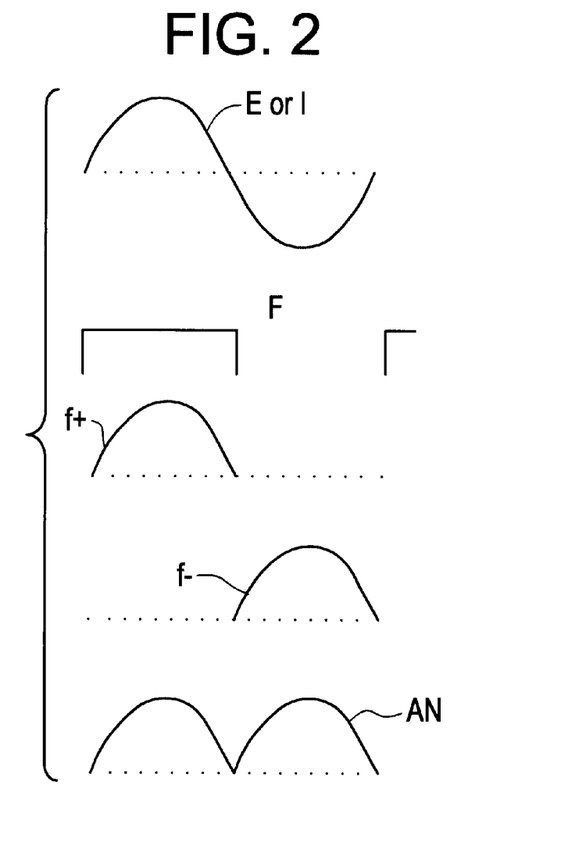
FIG. 2 shows combination of monopolar ADC inputs with logic inputs to determine four quadrant phasors.

Alternating current (AC) waves, voltage E and current I of FIG. 2, are rectified, shown as AN in FIG. 2, and fed to inputs AN0 through AN5 of an ADC preferably located on a microcontroller 1 (MC), see FIG. 3a. Further use is made of the nature of a unipolar ADC to act as a nearly perfect rectifier as in described in reference U.S. Pat. No. 5,315,527. A problem introduced by the full wave rectifier is that the polarities of the original E and I waves are lost, as illustrated by wave AN of FIG. 2. To overcome this loss and to form a true four quadrant phasor detector from the single unipolar ADC input, a squared wave, F in FIG. 2, is created at MC1 binary inputs F1 through F6 of FIG. 3a. The square wave identifies positive and negative half cycles of the rectified AC waves.

Programs are used in MC1 based on the inventions contained in U.S. Pat. No. 5,544,064 referenced above. Floating point arithmetic is not used. These programs run continuously using no interrupts. By adding do-nothing steps in program loops written in assembly language, the loop is completed just in time to find a new ADC result in the result register of MC1. This provides the highest possible digital sampling rate along with the longest possible computation time between digital samples using any selected MC.

The process is illustrated using a Motorola MC68HC16Z1 microcontroller (a microprocessor having an ADC). In reference to the Motorola M68HC16 Family User's Manual MC68HC16Z1UM/AD, which is incorporated herein by reference, one finds: (The page references below are in the aforesaid Manual.)

a) The maximum system clock for the MC68HC16Z1 is 16.78 MHz. Either a crystal (nominal frequency: 32.768 kHz) or an externally generated signal can be used. (Page 1—1).

b) The analog-to-digital converter module (ADC) is a unipolar, successive-approximation converter with eight modes of operation. It has selectable 8- or 10- bit resolution. (8- is used in the illustration contained herein). (Page 6.1).

The system clock must be divided by an integer number of at least 8 to obtain an ADC clock frequency of 2,097,500 cycles per second. (Rounded off to 2.1 MHz on page 6–14 and elsewhere of said referenced manual MC68HC16Z1UM/AD.)

c) As seen on page 6–15 of the referenced manual, an ADC resolution of 8 bits is obtainable using 16 ADC clock cycles conversion time per sample.

Note that in reference U.S. Pat. No. 5,315,527, it was found that greater than 8 bit resolution is obtainable from the averaging of errors in the type of ADC used in this selected microcontroller. Eight bit resolution is therefore chosen in the illustrated examples of the inventive concepts given below.

d) As seen on page 6–11 of the referenced manual, when the ADC is configured in Mode 6, continuous conversions are performed on each of four sequential input channels.

Note that mode 6 is useful when four or less ADC inputs are required.

e) As seen on page 6–11 of the referenced manual, when the ADC is configured in Mode 7, continuous conversions are performed on each of eight sequential input channels.

Note that mode 7 is useful when from five to eight ADC inputs are required.

In Mode 6, conversions in each channel occurs every 16×4 or 64 clock cycles. At a clock frequency of 2.1 MHz the period is 1/2.1 or 0.476 microseconds which multiplied by 64 gives a conversion every 30.5 microseconds. Since a 60 Hz wave has a period of 16,666.6 microseconds, a sample can be made every 16,666.6/30.5=547 digital samples per power frequency cycle.

In mode 7 a similar computation gives one half the rate for Mode 6 or 273 digital samples per power frequency cycle.

In applications using every ADC result, the microprocessor portion of the MC has 16×8=128 cycles, for addressing the ADC result register and making phasor computations. Selectively, by a designers choice, this number can be increased by a multiplier of 3, giving 384 clock cycles for the sampling and computing time, for applications requiring additional computing time. Increasing by a factor of three causes the digital samples to precess among the inputs so that all are accessed in sequence with intervening digital samples ignored. A factor of five may also be used, further increasing the available computing time but further reducing the number of digital samples per power frequency cycle.

Do-nothing steps are added to computation times to make them synchronous with the ADC conversions.

The identity of the ADC channels used in the computation is thus inherent in the writing of the microprocessor 1 program and no further addressing means are required. It is necessary, however, to initialize the program so as to identify a chosen channel as a starting point. As a first initializing alternative a clock on board MC1 is used to reinitialize the computation, say every second, in order to assure proper identity of the digital samples.

As a second initializing alternative the computation is reset by the first program after every four channels are computed when in Mode 6 and after every eight channels are computed when in Mode 7. In theory the time taken to reset the program may cause an error in the time sequencing of the digital samples, however the reset is accomplished at the highest MP1 clock frequency and is so short as to greatly minimize the error. The advantage of this second alternative is that accidental program interruptions by electrical transients are more quickly corrected.

The ADC of MC1 of FIG. 3a operates by charging a sampling capacitor to the analog input for two cycles of the ADC clock. At the highest ADC clock frequency of 2.1 MHz this sampling time is approximately two microseconds. This is unchanged by the increase in computation time by use of the aforementioned multipliers of three or five. The response time of potential transformers and current transformers providing the E and I waves must be such that a wave will not change more than the desired amplitude resolution during 2 microseconds.

Square waves, F, fed to MC1 terminals F1 through F6, are high when the corresponding wave is positive and low when they are negative. The sign of any digital sample is determined by sensing the appropriate F input just before a digital sample conversion starts. For example, binary input F1 is read just before a conversation starts for an input at AN0.

The Use of Cross Correlation

Cross correlations are made between selected digital samples and tables of sine and cosine functions to measure magnitudes of fundamental components of waves and phasors components of related harmonics, said phasors using said fundamental components as phase references.

Cross correlation is defined as:

$$C=(\Sigma a \times b)^{1/2}/(\Sigma a^2+\Sigma b^2)^{1/2}$$

Where C is a correlation number and "a" and "b" are functions each represented by a series of digital values. Each sum, $\Sigma$, is computed over the range of the values of "a" and "b". It is generally required that "a" and "b" have the same number of sample values. In the general case "a" is any monotonic function of a variable such as time and "b" is another monotonic function of the same variable. The cross correlation gives the similarity of the two functions for whatever reason.

As used herein, functions "a" and "b" are limited to the case of sine waves in time with related harmonics. The denominator is generally not used in this application.

In order to minimize the computation time by MP1 and thereby maximizing the number of samples per cycle, phasor component magnitudes are passed to MC2 as sums of products. The square roots of these sums are computed in MC2 producing the real and imaginary components of phasors. Selectively these components are converted to polar form by computing the square root of the squares of the real and reactive terms as the magnitude with an angle whose sine is real component/reactive component.

Phasor calculations for various protective relay and motor bus transfer applications are well known and will not be further described herein. Higher level languages may selectively be used in MC100, FIG. 3b.

Integrals of digital samples multiplied by sine and cosine functions represented by binary values stored in tables are formed in a sequence lasting 360° of an AC input wave at its nominal frequency. The signs of these integrals determine the polarity of the phasor components. A sum is calculated for one per unit voltage or current sine waves and entered as constants in the program. Division of measured integrals by these constants produces phasors normalized in magnitude to per unit terms.

FIG. 3a gives examples of circuits used to process three voltage waves along with examples of circuits used to process three current waves.

The voltages are shown having a common neutral (N) input connection. External potential transformers (PTs) are used as required for some inputs so as to input to this common connection N. Selectively printed circuit boards for the circuit of FIG. 3a use foils largely covering the outer sides of the boards. These are connected together by plated holes and connected externally to neutral. This effectively shields circuitry carried on inner layers of the boards having four or more layers.

Figure 1:
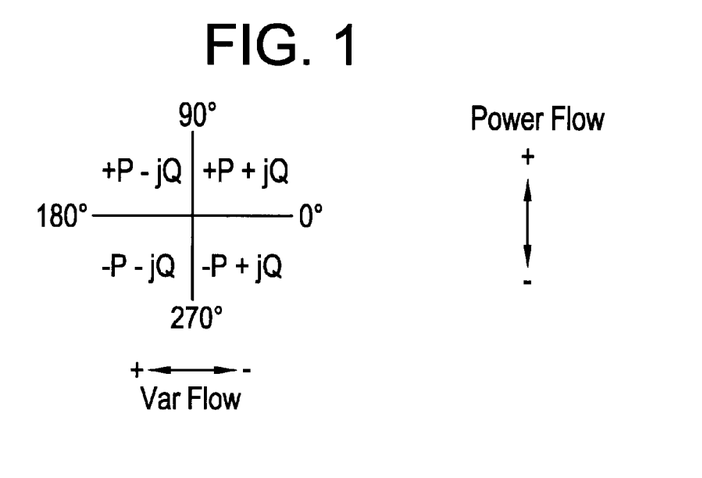
FIG. 1 shows relations between four quadrants of phasors.

Digital wave samples are processed by first multiplying each of a series of samples by numbers from a table corresponding to values of a sine function from zero to 360°. The resultant products are summed just following computation. This gives a first sum value with its sign related to the real or P component of a phasor. A second sum is formed in a similar manner using numbers representing 360° of a cosine function and gives a result related to the imaginary or Q component of a phasor. Phasors are thus located in one of the four quadrants of FIG. 1.

It may be most convenient for a programmer to provide a table of alternating sine and cosine values so as to enable computation of the P and Q results in less computation cycles.

In some applications, measurement of the third and fifth harmonics of the power frequency may be required. This is provided by multiplying the digital samples by stored tables of the harmonic and summing the result as covered in more detail in reference U.S. Pat. No. 5,774,366. As described in this patent, use of first one and then a second table gives harmonic components 90° apart, thus providing phasors for the harmonics.

These phasors are produced in a first MC1 at a rate of one set for each cycle of the power frequency. These sets of phasors are transferred over the high speed synchronous busses provided by port E of the MC68HC16Z1 as the sums are completed to a second MC100, see FIG. 3b. This is preferably from the same family of devices as MC1 except that MC100 need have no ADC. In practice, however, it is most convenient to use the same device, such as the MC8HC16Z1, for both MC1 and MC100.

A program in a second microprocessor contained in MC100 makes computations using the phasors as inputs so as to determine the desired overall device response to changes in the phasors. Selectively programs for devices 1 and 100 are held in programmable read only memory (ROM) on board each device. Alternatively programs are held in flash memory requiring additional chips and having the advantage of being reprogrammable through communication ports.

Local communications is not shown but is furnished using means such as insulated RS232 ports 102 of FIG. 3b connectable to portable computers for program entry and for modification and setting of setpoints as required. One alternate method of communications is by two way infra red ports. A second alternate method of communications is by radio as described in U.S. patent application Ser. No. 710, 816 referenced above. Any of the three methods provide desirable isolation of the communications inputs and the input connections N. Minimal communications as to the status of devices containing MC1 and MC100 is provided by light emitting diodes (LEDs) D100 through D101 as selectively activated by input pushbutton switches PB1 connected from MC1 binary inputs to neutral Ns (See FIG. 3b).

It is well known from applications of reference U.S. Pat. No. 5,315,527 that approximately four bits of added resolution in the magnitude of phasor components will be obtained when summing a large number of ADC samples due to cancelling of the errors in the sizes of the capacitors used in the ADC conversion process. With the ADC set for 8 bits resolution, 12 bits resolution are obtained.

The resolution is further extended for current waves, if necessary, by program switching of CT burdens R8 and R9 using switches 7 and 8 of FIG. 3a as driven by binary outputs PC1 and PC0 of MC1. Additional burdens are selectively included and switched as required by application conditions. Alternatively programmable gain amplifiers (As shown in reference prior art U.S. Pat. No. 5,224,011) can be used in the current signal paths to the ADC with the amplifier gain set by outputs from MC1.

In order to make most efficient use of the 16 bit processing with the microprocessor used for illustration, the ADC may preferably be set for 8 bit resolution and tables used having 8 bit numbers. This produces 16 bit products most efficiently handled by the 16 bit processor. Multiplying the conversion time of 16 ADC microprocessor clock cycles by the difference of 8 gives 8 * 16 or 128 cycles of computation cycles as the available length of each computation time between digital samples.

While phasor results once per cycle may be adequate for selected applications, additional sets may be produced by selectively starting sums at points during computation of the first sum described above. For example, a second set of sums started midway during the computation of the first set of sums provides recognition of phasor changes in one half cycle of the AC waves. Four sets of sums started at quarter cycle intervals provides recognition of phasor changes in one quarter cycle of the AC wave.

Power for the circuitry of FIG. 3a and FIG. 3b is shown as supplied from a 12 Vdc bus with negative terminal common to the equipment neutral bus. Selectively this is a 12 volt lead acid battery with charger. Alternate voltages are 24 and 48 VDC. Alternatively 5 VDC is input from DC/DC converters from station batteries or secure AC control power sources. In such cases, regulator 2 is not used.

The inventive protection provides a reduction in size and a reduction in cost over the present art.

FIGS. 3a and 3b illustrate a circuit useful for power generator protection. Details for a device protective of rotating three phase generators follow hereinunder.

In FIG. 3a, MC1 has a 5 Vdc power input VDD and return VSS connected to neutral input connection N, binary inputs F1, F2, F3,F4, F5, F6 and F7, ADC outputs AN0, AN1, AN2, AN3, AN4 and AN5, binary inputs PC0, PC1, PC2, PC3, PC4 and PC5, crystal (XTAL) connections XTAL and EXTAL, clock out (CLK OUT), together with two high speed synchronous data connections DATA. Input direct current power 12 VDC connects to voltage regulator 2 supplying 5 VDC to VDD. Upper ADC voltage limit VRH is provided by precision regulator 3 and lower ADC limit VRH is provided by connection to neutral N.

Three phase AC voltages EA, EB and EC each connect to identical signal conditioning circuitry only one of which will be described in detail. EA connects to neutral N via resistors R2 and R3 producing signal E of FIG. 2. Signal E is a voltage chosen not to exceed the linear range of ADC input AN0. Resistor R1 supplies current through diode D1 sufficiently low as not to effect the regulator 2 output voltage during the positive portion of the cycle of voltage E and through diode D2 to neutral during the negative portion of the cycle. This produces a square wave voltage into MC input F1 further sharpened in squareness by the binary nature of the MC1 input so as to be accurately read by the first synchronous program within MC1. Transistors Q1 and Q2 form a double emitter follower and gate 13 for positive going analog voltage inputs. One input to this and gate, f+, is formed during the positive portions of voltage E by Resistor R25 and Diode D3. A second input, f−, is from an analog polarity inverter consisting of operational amplifier 10 and resistors R4 and R5 forming positive inputs to AN0 during the negative going portions of voltage E. Circuitry 5 and 6 having inputs EB and EC respectively are exact duplicates of the circuitry having inputs EA and will not be described in further detail.

Three phase AC currents IA, IB and IC each connect to identical signal conditioning circuitry only one of which will be described in detail. Currents IA flow through primaries of current transformers (CT) T1, entering as current IA and leaving as current IA'. CT T1 output currents I1 and I2 flow serially through resistors R10 and R11 with center points of said resistors connected to neutral N. Transistors Q3 and Q4 form a double emitter follower "and" gate 13 for positive going analog current inputs AN (of FIG. 2) connected to ADC input AN3. Positive portions of currents I1 flow from neutral N through diodes D11 and through resistors R10 forming voltage inputs f+to and gates 13. Positive portions of currents I2 flow from neutral N through diodes D10 and through resistors R11 forming providing inputs f− to gates 13. When current I1 flows through diode D10 the voltage drop switches the output of operational amplifier 9 from low to high voltage quickly driving binary input F4 to a high state thus providing an accurate detection of zero crossings of current IA for reading by programs contained in MC1. Circuitry 10 and 11 having inputs IB and IC respectively are exact duplicates of the circuitry having inputs IA and will not be described in further detail.

Synchronous two way communications is established between MC1 and MC100 as shown on FIGS. 3a and 3b. Since the first program in MC1 is written by the programmer with full knowledge of the second program which the programmer writes for MC100, the programmer plans the programs using a two way communications protocol that avoids data clashes between communications traffic in the two directions.

The crystal 12 used to establish the clock rate for MC1 also provides a CLK OUT signal connected to MC100 to establish the clock in MC100 in synchronism with the MC1 clock.

Typical Applications

The inventive apparatus and programming methods are useful in three phase protection of rotating generators and power transformers. Because of the lower cost of equipment using the invention, however, typical applications are more likely found in areas not presently served by present practice. Several such uses are described in greater detail hereinunder.

Motor Bus Transfer

Many motor bus applications, especially at industrial sites, do not justify the higher costs of prior art equipment using U.S. Pat. Nos. 4,310,771, 4,256,972 and 4,311,919 cited hereinabove and simplified inventive devices are applicable.

Three sets of voltage inputs are used, one to a motor bus and one each for two alternate sources of power. These two supply busses are referred to as the present bus, "P", and the next bus, "N". In general the role of the two supply busses alternates between P and N with each power transfer.

Initiation of a motor bus transfer may be manual or may be from the detection of a problem on the P bus. In either case, breakers are opened removing the motors from the P bus.

While three phase protective relays require measuring full cycles of voltage and current waves, motor bus transfer relays do not involve determination of fault currents but are initiated by the detection and interruption of motor bus faults and other motor related problems by other equipment. This other equipment then initiates a bus transfer.

Figure 4:
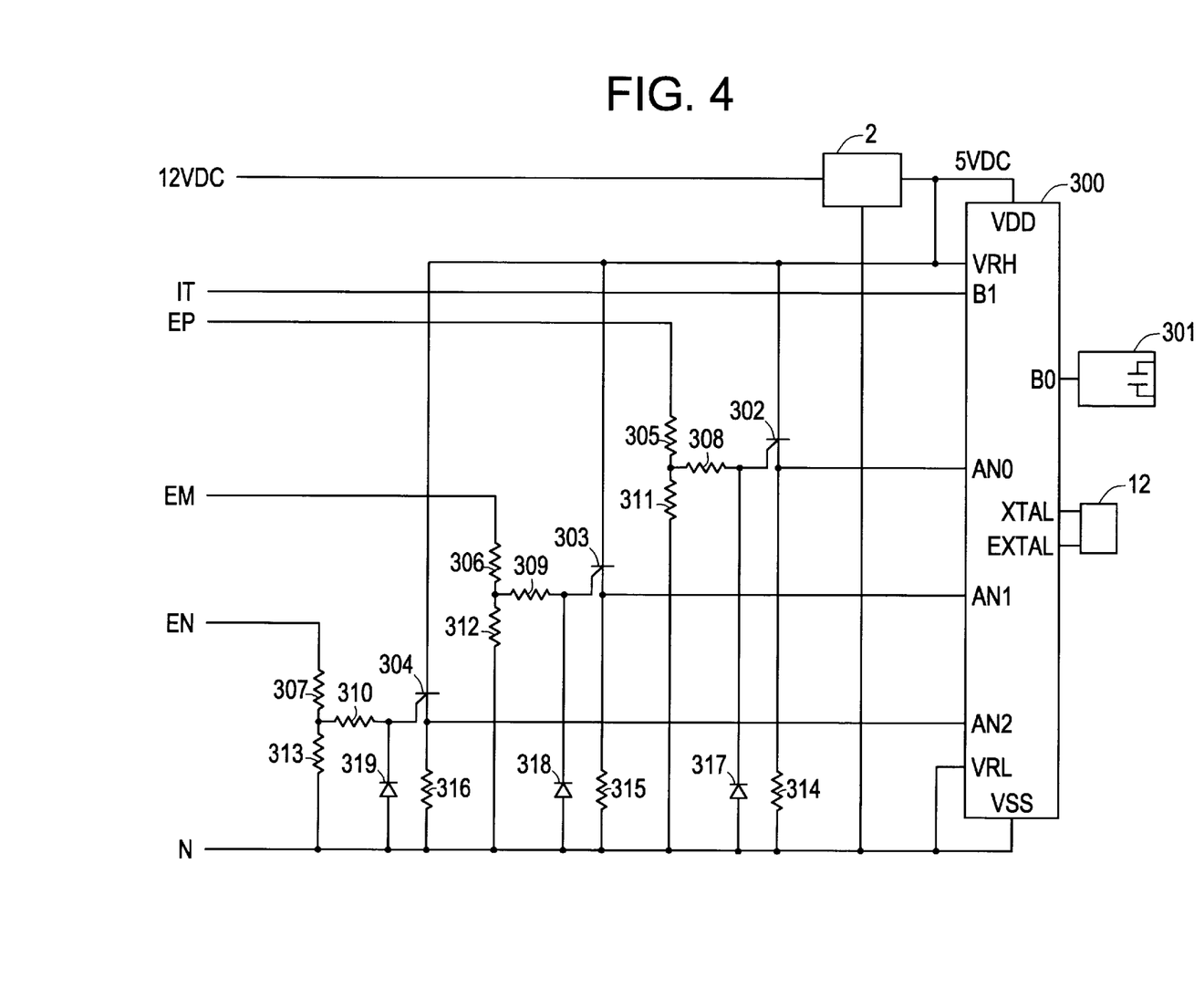
FIG. 4 illustrates a circuit with three voltage inputs useful for motor bus transfer applications.

Costs are reduced by combining phasor measurements in positive half cycles of voltage waves with transfer calculations during negative half cycles. FIG. 4 illustrates a circuit useful in transferring motor busses from one supply to another.

The voltage magnitudes of inputs EP (present bus voltage), EM (motor bus voltage) and EN (next bus voltage) are measured during positive half cycles using apparatus and methods described by reference U.S. Pat. No. 5,315,527. The relative times between the three inputs is determined by microprocessor counters measuring times from the first non-zero sample of one wave to the first nonzero sample of another wave.

The difference between EP and EM is expected to be zero until a binary signal at IT, from an external protective device, signals initiation of a transfer. This is generally a contact from said protective device which also trips a circuit breaker between the motor bus and the present bus. The change in time between EP and EM is compared to the time between the EP and EN and the time of synchronism of the motor bus and new bus is predicted so as to initiate closing of a breaker between the motor and new bus at an advance time equal to the closing time of the breaker about to be closed. These time predictions are made with use of a model of the nonlinear change in the motor bus speed with time. This type of close is known as "synchronous transfer".

If the determination of EP-EB just after receiving IT is less than a selectable amount, the breaker is closed immediately in what is known as "fast transfer".

The magnitude of the motor bus voltage is continuously compared to a selectable undervoltage limit and the breaker between the motor and the new bus is closed immediately if the undervoltge limit is met. This is known as "undervoltage closing" and has the advantage that the motor bus in-rush current is then less than the motors bus starting current if the motors had been allowed to come to a complete stop.

In FIG. 4 device power is supplied by an external 12 volt battery connected from terminal marked "12 Vdc" to N (neutral). This device power can be as simple as an automobile battery with charger. Selectively the supply is any other source of dc voltage such as 24, 48 and 120 volt batteries. Further selectively, regulator 2 obtains input power from a capacitor fed with positive charge through three diodes connected to EP, EM and EN (these components not shown). Power is thus available when any of the three inputs EP, EB or EN is powered. Regulator 2 converts the input dc voltage to 5 Vdc. The 5 Vdc supplies microprocessor 300 (hereinafter known as MP300) supply terminal VDD and upper voltage reference terminal VRH along with collector of transistors 302, 303 and 304 (hereinafter referred to as TR302, TR303 and TR304 respectively). Terminal EP brings voltage waves from the present bus to a voltage divider consisting of resistors 305 and 311. Divided voltage is fed through resistor 308 to the base of TR302. Diode 317 is connected from TR302 base to neutral effectively limiting the negative half cycle of AC voltages to approximately–0.7 volts from TR302 base to emitter. TR302 emitter draws current through resistor 314 during positive AC half cycles and provides positive half cycles of voltage waves to MP300 analog to digital converter (ADC) input AN0. Terminal EM brings voltage waves from the motor bus to a voltage divider consisting of resistors 306 and 312. Divided voltage is fed through resistor 309 to the base of TR303. Diode 318 is connected from TR303 base to neutral effectively limiting the negative half cycle of AC voltages to approximately −0.7 volts from TR303 base to emitter. TR303 emitter draws current through resistor 315 during positive AC half cycles and provides positive half cycles of voltage waves to ADC input AN1. Terminal EN brings voltage waves from the new bus to a voltage divider consisting of resistors 307 and 313. Divided voltage is fed through resistor 310 to the base of TR304. Diode 319 is connected from TR304 base to neutral effectively limiting the negative half cycle of AC voltages to approximately −0.7 volts from TR304 base to emitter. TR304 emitter draws current through resistor 316 during positive AC half cycles and provides positive half cycles of voltage waves to ADC input AN2. Crystal 12 is connected to MP300 terminals XTAL and EXTAL providing control of the MP300 bit rate. MP300 binary output BO closes a contact in output circuit 301 using well known circuitry not otherwise shown in detail. Negative supply N is connected to MP terminal VSS as is the ADC voltage reference low, VRL.

While FIG. 4 illustrates a most economical use of a single microprocessor it is to be understood that additional microprocessors may be required to accommodate other than the most simple conditions for motor bus transfer.

Dispersed Generation (DG)

The following single phase devices use a single microprocessor for both phasor measurement and phasor computation for abnormal condition determination. This is accomplished by measuring phasors during positive half cycles of input AC waves and determining abnormal conditions during times where both voltage and current waves negative. This results in greater numbers of digital samples of waves being taken during said positive half cycles thus yielding greater accuracy of phasor components. All computation is done in the negative half cycles.

An inventive device, not shown in detail herein, provides backup disconnection of electronic generators intended to supply power to improve power quality. Such generators may furnish power during the first part of each cycle when many phase controlled loads have not yet turned on. They may also furnish power during voltage dips or power interruptions of, for example up to one second duration. Using capacitors for energy storage, such devices are incapable of handling the magnitude of fault currents deliverable from rotating synchronous generators. These generators may have internal means for disconnection upon determining factors indicating such a disconnection is necessary. For safety reasons however, some users require said backup devices duplicating the protective disconnection contained in the power quality generator.

Dispersed solar and other small sources of electrical energy are used in increasing numbers in homes and small businesses. These are generally single phase, supplying some but not always all of the buildings requirements.

A safety requirement may be for devices disconnecting such sources so as to permit maintenance work on nearby outside lines when these lines become disconnected from an electric power system.

Fuses are being developed that will blow in normal fashion with through current. They will also blow with the injection of a small current into a third terminal. They are not unlike ground fault circuit breakers except for requiring replacement once blown. The three terminal fuses have the advantage of being of selectable current rating for use in a common receptacle. In addition devices such as described hereinunder may be installed outside of buildings under the control of line maintenance personnel for their protective use.

Figure 5:
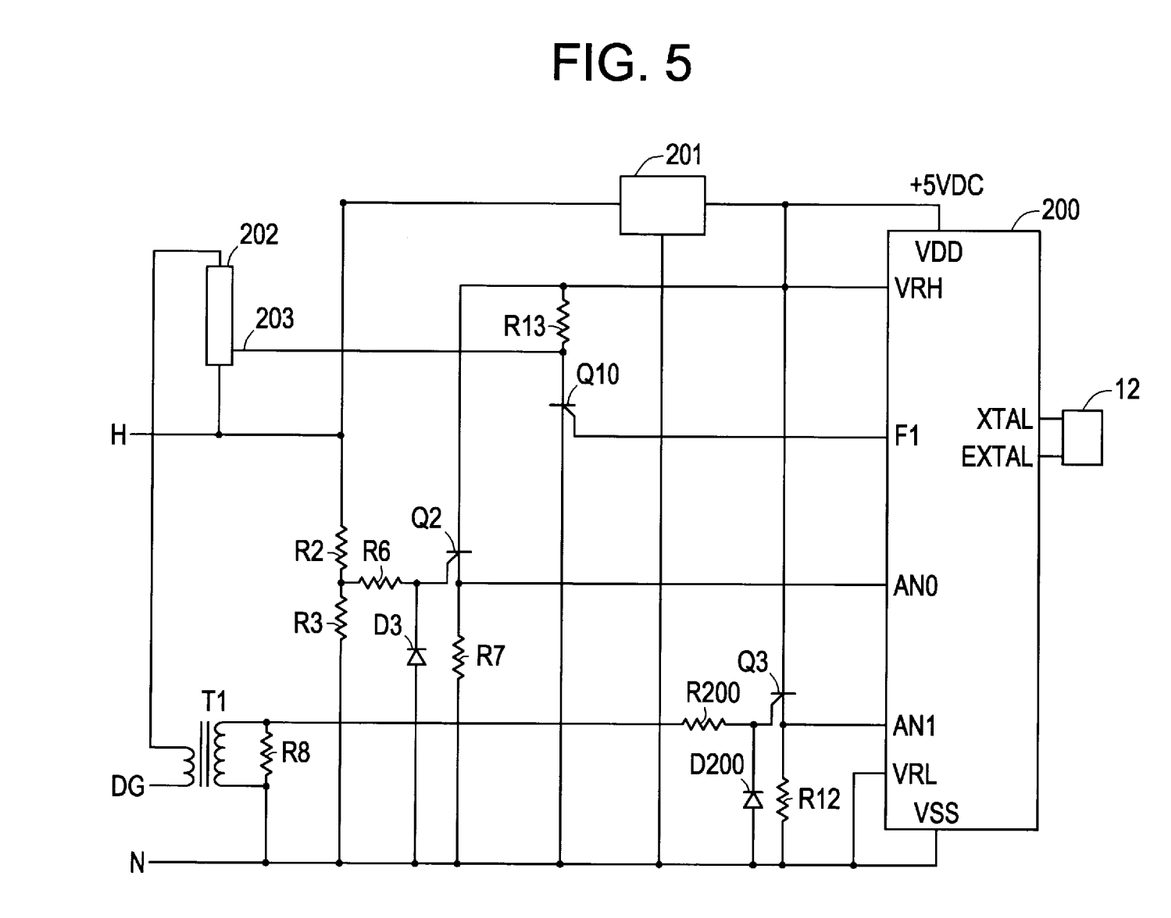
FIG. 5 shows single phase inventive protective relay circuitry using "smart" three terminal fuses to interrupt currents.

FIG. 5 illustrates a circuit for sensing a single phase voltage from hot AC input, H, to neutral, N, and AC dispersed generation current input DG. Three terminal fuse 202 is as described in the previous paragraph. Microprocessor 200 computes voltage magnitudes during positive half cycles and current phasors using the voltage as reference. Current DG is connected so as to generally be in phase with the voltage H leaving time for tripping calculation when both voltage and current waves are negative. When a trip condition is determined MP200 binary output F1 turns off transistor Q10 permitting resistor R13 to feed a small current into terminal 203 of three terminal fuse 202 causing said fuse to blow interrupting power to DG. Said fuse also blows normally upon excessive DG current.

Input AC current DG creates an AC voltage across current transformer T1 secondary burden R8. This voltage is fed to ADC input AN1 through an emitter follower circuit using transistor Q3 and resistors R200 and R12. This acts as a zero crossing detector to place a rather perfect positive voltage half wave at input AN1.

Resistors R2 and R3 divide AC voltages from H to N and provide an input for emitter follower consisting of R6, R7 and transistor Q2 with output connected to microprocessor 200 ADC input AN0. Diodes D3 and D200 suppress negative voltage half cycles thus protecting transistors Q2 and Q3.

Power supply 201 converts AC voltages from HI to N to 5 vdc for MP200 and transistors Q2 and Q3.

Tripping conditions may include:
1) Reverse power flow.
2) Under/over frequency.
3) Under/over voltage.

Figure 6:
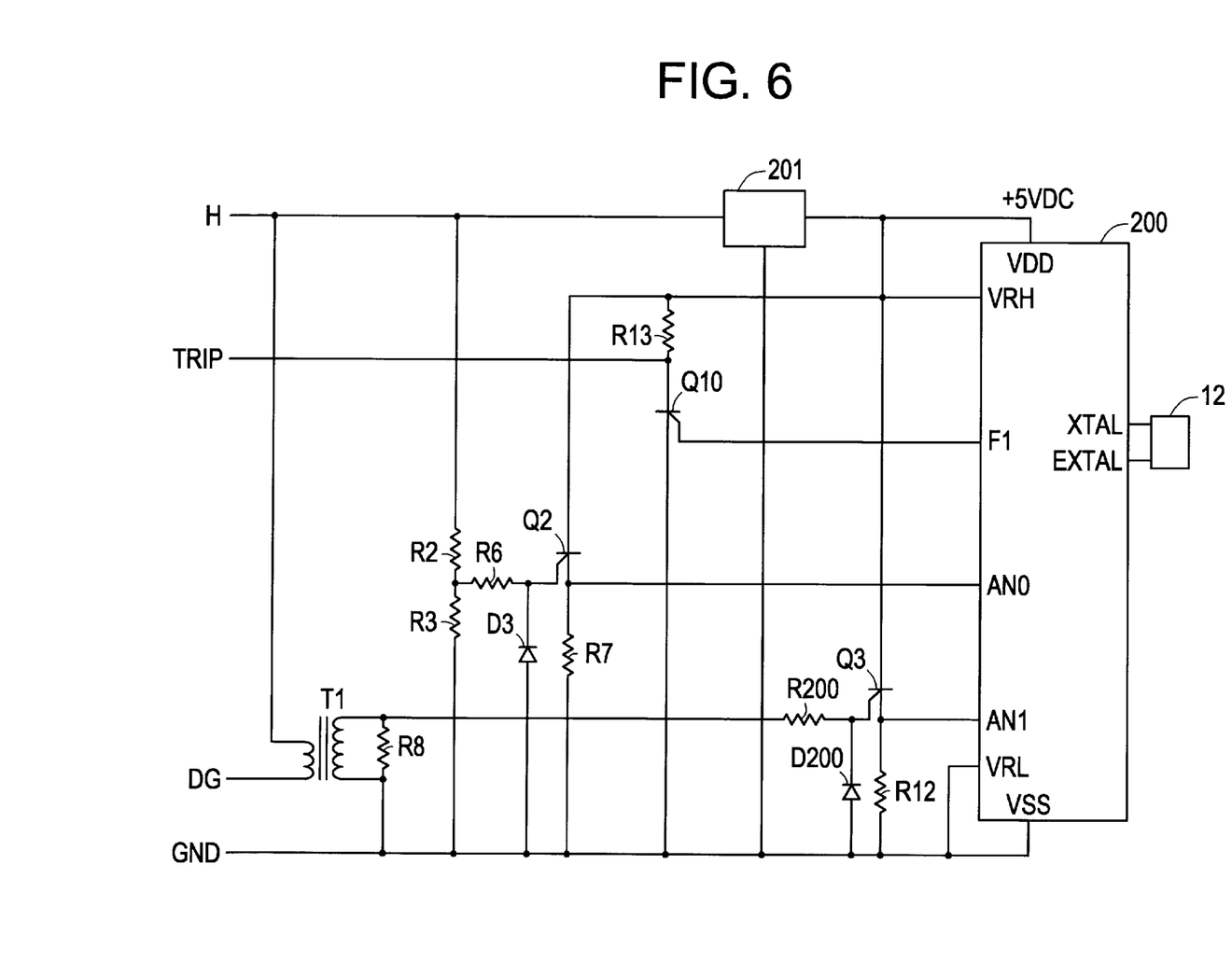
FIG. 6 shows single phase inventive protective relay circuits using small ground currents to cause ground fault circuit breakers to interrupt currents.

FIG. 6 illustrates a circuit similar to that of FIG. 5 except that a ground fault circuit breaker (not shown) is used to interrupt dispersed generation current. Voltage for said DG devices are connected to an AC source H to neutral (not shown but generally externally connected to ground GND). MP 200 output F1 drives transistor Q10 causing tripping ground current through resistor R13 to terminal GND upon determination of tripping conditions. All other components function as described under FIG. 5, above.

Tripping conditions include those itemized under FIG. 5.
Advantages of this invention include:
1) Eliminates the need for dual ported RAMs and high speed DSPs for determining and analyzing phasors of AC waves.
2) Higher speed tripping of circuit breakers to clear faults.
3) Accurate measurement of the fundamental and harmonic phasors of each cycle of an AC wave.
4) Matching and exceeding capabilities of analog circuitry for analyzing AC waves.
5) Providing easy user programmability of devices using the inventive technology.
6) Lower cost apparatus for high speed clearing of AC power fault conditions.
(7) Low cost means for preventing low energy single phase dispersed generators from backfeeding dangerous voltages to power lines when the lines become disconnected from power networks.

What I claim is:

1. A method for using first and second microprocessors to measure and process phasors of three phase AC waves, the method consisting of the steps of:
   a) storing tables of values of sine and cosine functions in said first microprocessor,
   b) sending positive rectified half cycles of said AC waves to unipolar analog to digital converter (ADC) inputs provided by said first microprocessor,
   c) forming square waves from said AC waves with first levels indicating positive half cycles and second levels indicating negative half cycles of said waves,
   d) applying said square waves to binary input inputs provided by said first microprocessor,
   e) combining results from said ADC with logic levels produced by said binary inputs in forming sums of the products of digital samples from said ADCs and values taken from said tables of values
   thereby measuring phasors of AC waves.

2. A method as in claim 1 further including the steps of:
   a) communicating said sums of products to said second microprocessor, and
   b) determining outputs by computations in said second microprocessor using said sums of products
   thereby processing phasors of said AC waves.

3. A method as in claim 2 wherein said outputs are used for clearing electric power faults.

4. A method as in claim 2 wherein said outputs are used to transfer motor busses from one source of electric power to another.

5. A method as in claim 1 further including the steps of:
   a) synchronizing programs in said first microprocessor with said ADCs, and
   b) synchronizing programs in said second microprocessor with said programs in said first microprocessor, and
   c) using programs written so as to avoid communications data clashes.

6. A method for using a single microprocessor to measure and process phasors of single phase AC waves, the method consisting of the steps of:
   a) inputting positive half cycles of voltage waves from first sources of electric power to first ADC inputs provided by said microprocessor,
   b) inputting positive half cycles of voltage waves from second sources of electric power to second ADC inputs provided by said microprocessor,
   c) inputting positive half cycles of voltage waves from motor busses to third ADC inputs provided by said microprocessor,
   d) calculating conditions for transferring said motor bus from one to the other of said first and second sources of electric power, and
   e) providing bus transfer outputs as determined by said calculations.

7. A method for using a single microprocessor for operating disconnection devices for disconnecting single phase generators from power lines during abnormal conditions, the method consisting of the steps of:
   a) sending positive half cycles of voltage waves to first ADC inputs provided by said microprocessor,
   b) sending positive half cycles of current waves from said small generators to second ADC inputs provided by said microprocessor,
   c) connecting said voltages and currents so as to generally be in phase,
   d) making calculations, during times when voltage and current waves are negative, for determining abnormal conditions, and
   e) operating said disconnection devices during said abnormal conditions.

8. A method as in claim 7 further including the step of using microprocessor programs synchronous with said ADCs.

9. A method as in claim 8 including the step of conducting a current to ground so as to open a ground fault circuit breaker
   thereby interrupting the output of a generator associated with said breaker.

10. A method of using one microprocessor to measure and process phasors of AC voltage and current waves, the method consisting of the steps of:
   a) storing tables of values of half cycles of sine and cosine waves in said microprocessor,
   b) taking sums of products of samples of AC waves and values from said tables in positive half cycles of voltage and current waves,
   c) obtaining phasors by taking the square root of said sums of products during times when both voltage and current waves are negative, and
   d) completing the processing of said phasors so as to obtain desired results during said times
   thereby improving phasor accuracy by maximizing the number of samples taken.

11. Apparatus for measuring and processing phasors of AC voltage and current waves comprising in combination:
   a) first microprocessor means having on board analog to digital converter (ADC) means,
   b) said first microprocessor means taking digital samples of said AC waves and continuously processing said samples to obtain phasors of said AC waves,
   c) second microprocessor means receiving and processing said phasors and determining outputs,
   d) synchronizing means for operating said first and second microprocessors at the same clock frequency, and
   e) two way communication means for communicating between said first and second microprocessors.

12. Apparatus as in claim 11 further including means for synchronous programs in said first and second microprocessors having preplanned communications protocols so as to eliminate data clashes in the two directions of data flow.

13. Apparatus as in claim 11 further including means for providing outputs to clear power faults when so indicated by said phasors.

14. Apparatus as in claim 11 further including means for providing outputs to transfer motor busses.

15. Apparatus as in claim 11 further comprising in combination:
   a) means of rectifying said AC waves and applying as positive half cycles to said ADCs,
   b) means for producing square waves representing said waves whereby a first level indicates positive portions of said waves and a second level indicates negative portions of said waves,
   c) means for applying said square waves to binary input terminals of said microprocessor, and
   d) program means for combining results from said ADCs with logic levels produced by said binary inputs to form four quadrant phasors.

16. Apparatus for measuring single phase phasors of AC voltage and current waves comprising in combination:
   a) microprocessor means having onboard analog to digital converter (ADC) means,
   b) program means for measuring amplitudes of said voltage waves during positive half cycles of said waves,
   c) program means for measuring phasors of said current waves using said positive half cycle of said voltage waves as phasor references, and
   d) program means for processing said amplitudes and phasors and determining outputs during time periods when both voltage and current waves are negative.

17. Apparatus as in claim 16 further comprising in combination:
   a) ground fault circuit breaker means for interrupting outputs of said apparatus, and
   b) means for causing said outputs to provide current flow to ground thereby tripping said ground fault circuit breakers.

18. A method for using first and second microprocessors to obtain and process phasors of three phase AC waves, the method consisting of the steps of:
   a) storing tables of values of sine and cosine functions;
   b) sending rectified half cycles of said three phase AC waves to unipolar analog to digital converter (ADC) inputs provided by said first microprocessor;
   c) forming square waves from said three phase AC waves with first levels identifying positive half cycles and second levels identifying negative half cycles of said three phase AC waves;
   d) applying said square waves to binary inputs provided by said first microprocessor; and
   e) combining inputs from said ADC with logic levels produced by said binary inputs provided by said first microprocessor in forming sums of the products of digital outputs from said ADCs, and values taken from said tables of values of sine and cosine functions thereby obtaining full wave phasors of AC waves.

19. A method as in claim 18 further including the steps of:
   a) taking said sums of products an interger number of times per cycle of AC waves,
   b) starting said sums of products an integer number of times per cycle of AC waves,
   c) transferring said sums of products at the end of AC cycles, and
   d) processing said sums of products and obtaining said results and integer number of times per cycle
   whereby response times faster than one cycle are obtained.

* * * * *